(12) United States Patent  (10) Patent No.: US 12,494,366 B2
Chang et al.  (45) Date of Patent: Dec. 9, 2025

(54) METHOD OF MANUFACTURING SEMICONDUCTOR DEVICES AND SEMICONDUCTOR DEVICES

(71) Applicant: TAIWAN SEMICONDUCTOR MANUFACTURING COMPANY, LTD., Hsinchu (TW)

(72) Inventors: Shih-Ming Chang, Hsinchu (TW); Yu-Tse Lai, Zhubei (TW); Yu-Fu Wang, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 199 days.

(21) Appl. No.: 17/840,480

(22) Filed: Jun. 14, 2022

(65) Prior Publication Data

US 2023/0317451 A1  Oct. 5, 2023

Related U.S. Application Data

(60) Provisional application No. 63/325,054, filed on Mar. 29, 2022.

(51) Int. Cl.
 *H01L 21/02* (2006.01)
 *H01L 21/308* (2006.01)
(52) U.S. Cl.
 CPC .. *H01L 21/02697* (2013.01); *H01L 21/02252* (2013.01); *H01L 21/308* (2013.01)

(58) Field of Classification Search
 CPC .............................. H10N 70/823; H01C 17/26
 See application file for complete search history.

(56) References Cited

U.S. PATENT DOCUMENTS

| | | | |
|---|---|---|---|
| 11,004,729 B2 | 5/2021 | Liu et al. | |
| 2001/0055852 A1* | 12/2001 | Moise | H10B 12/033 257/E21.252 |
| 2006/0054997 A1* | 3/2006 | Menon | H01L 23/5228 257/536 |
| 2010/0072574 A1* | 3/2010 | Ohshima | H01C 13/02 257/E29.325 |
| 2011/0260171 A1 | 10/2011 | Yamazaki | |
| 2013/0299764 A1* | 11/2013 | Tan | H10B 63/20 257/E45.001 |
| 2017/0338281 A1* | 11/2017 | Bedau | H10N 70/823 |

FOREIGN PATENT DOCUMENTS

| | | |
|---|---|---|
| TW | 201742160 A | 12/2017 |
| TW | 202002046 A | 1/2020 |

\* cited by examiner

*Primary Examiner* — Erik Kielin
(74) *Attorney, Agent, or Firm* — STUDEBAKER BRACKETT PLLC

(57) ABSTRACT

In a method of manufacturing a semiconductor device, a conductive pattern is formed in a surface region of a dielectric layer, a mask pattern including an opening over the conductive pattern is formed over the dielectric layer, a part of the conductive pattern is converted into a high-resistant part having a higher resistivity than the conductive pattern before the converting through the opening, and the mask pattern is removed.

20 Claims, 16 Drawing Sheets

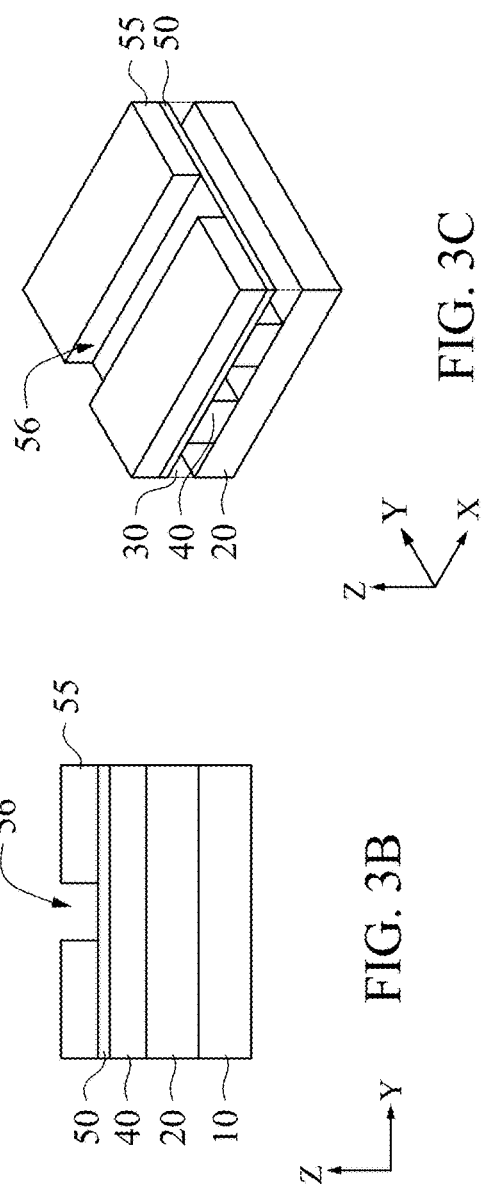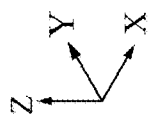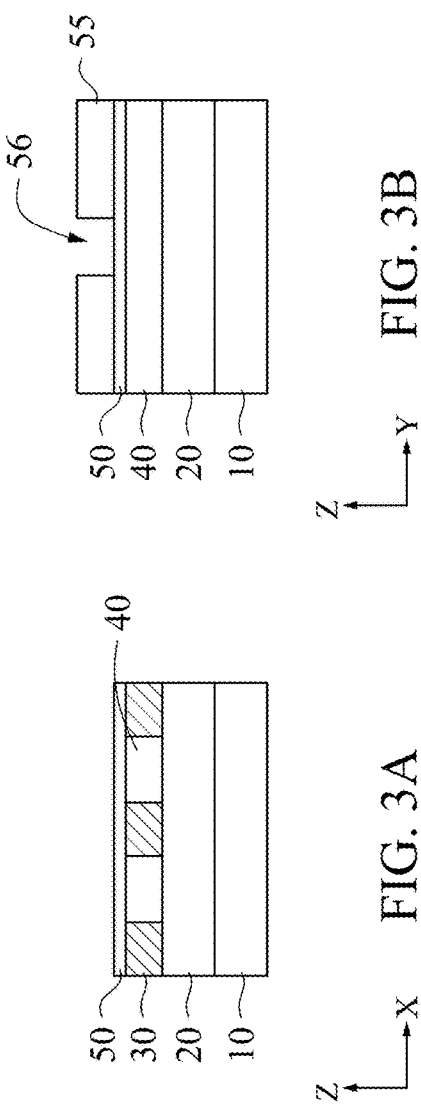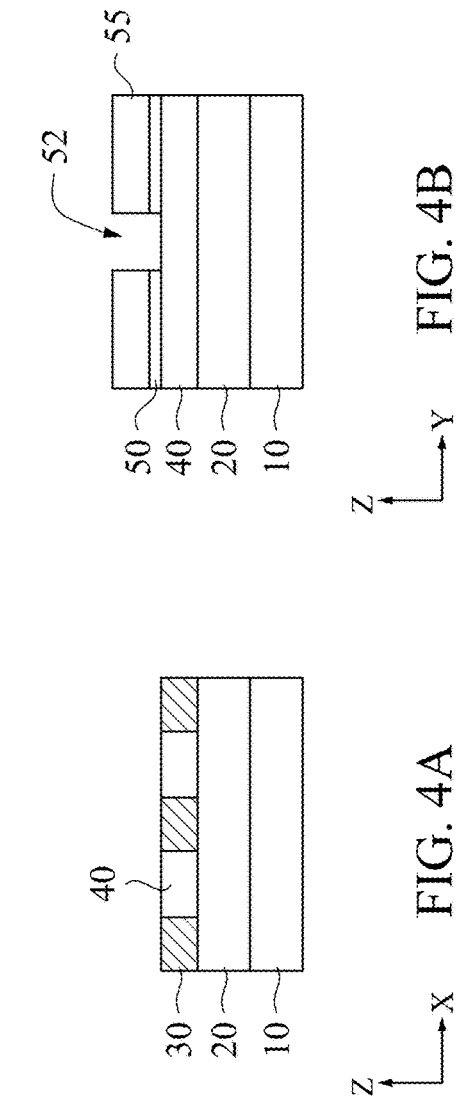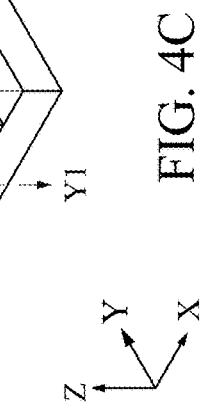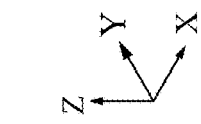

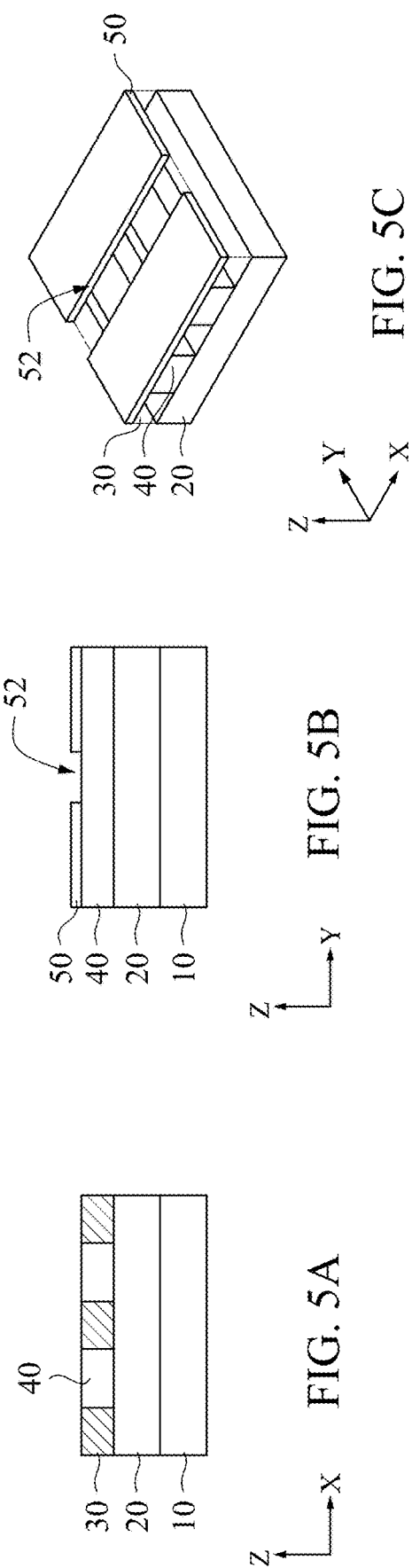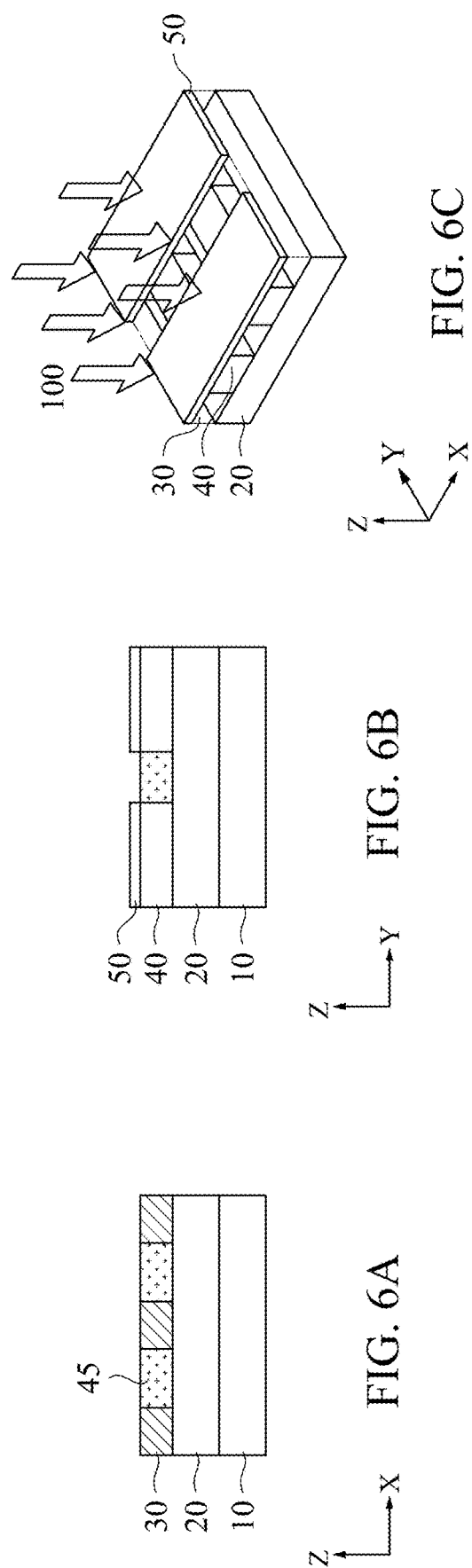

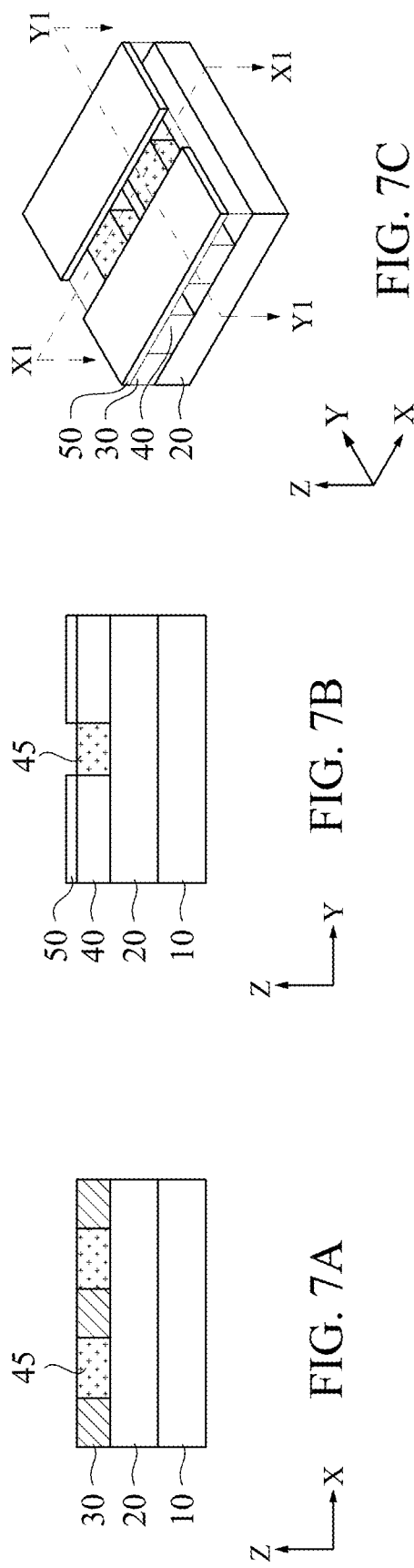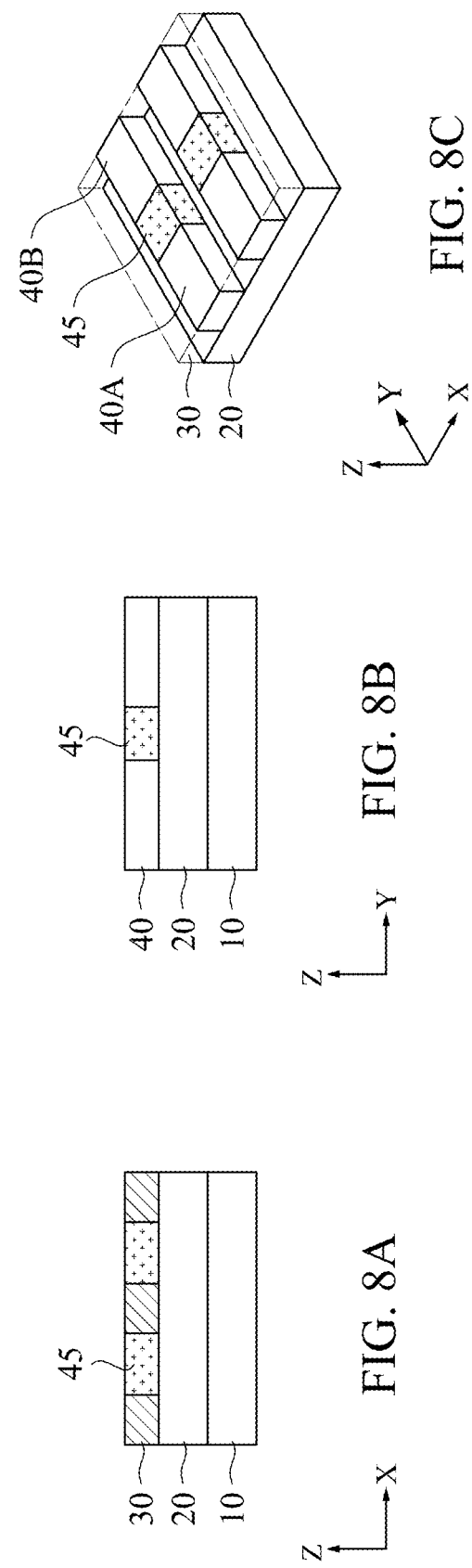

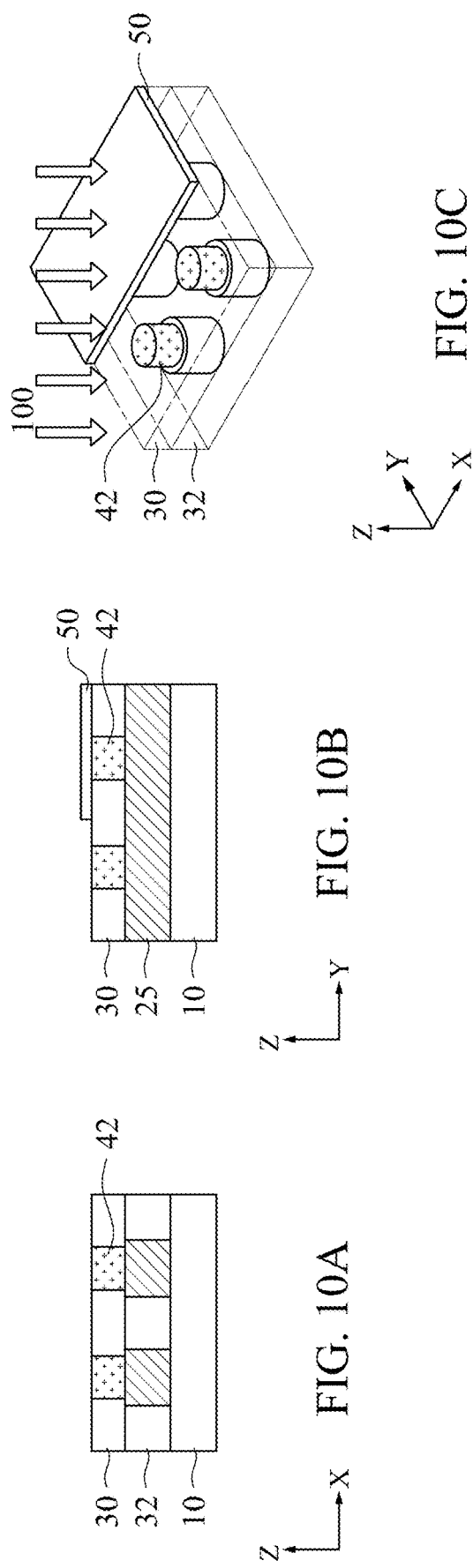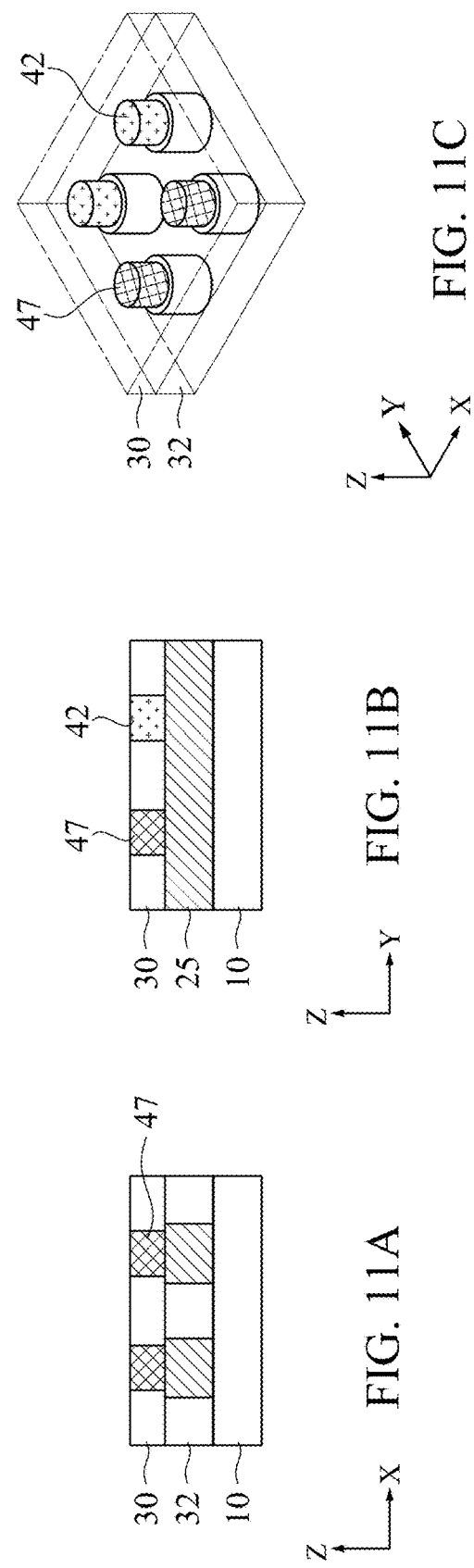

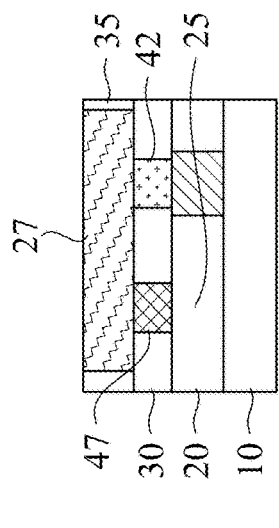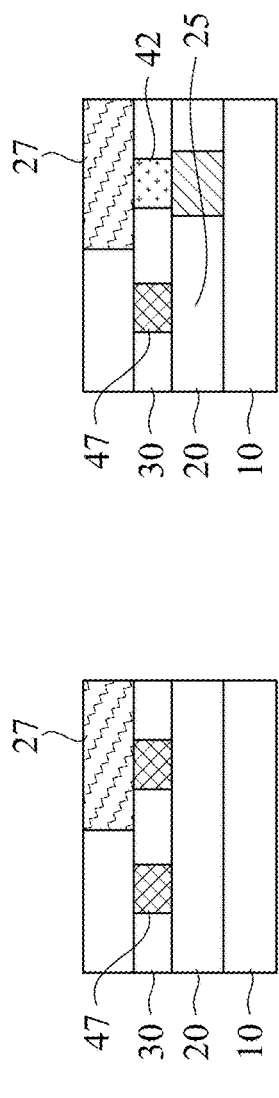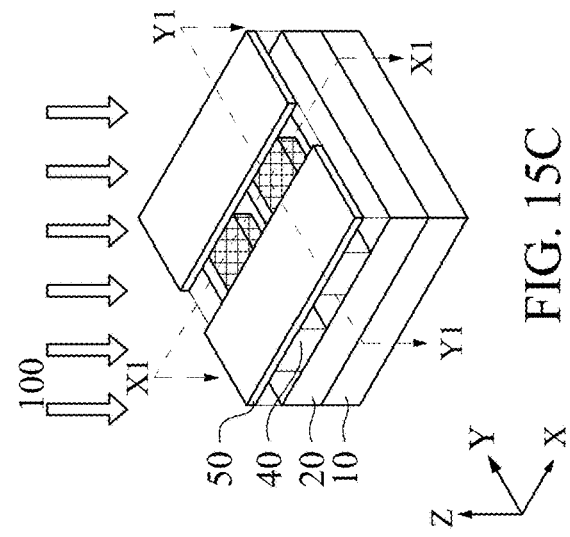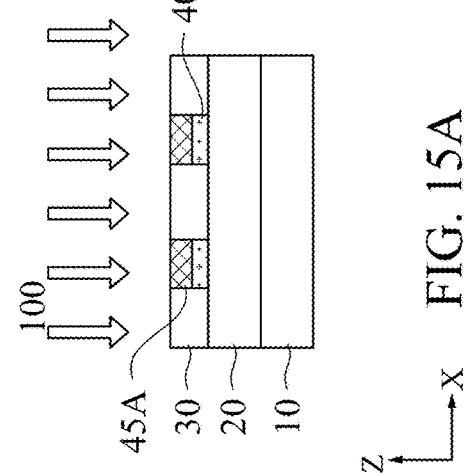

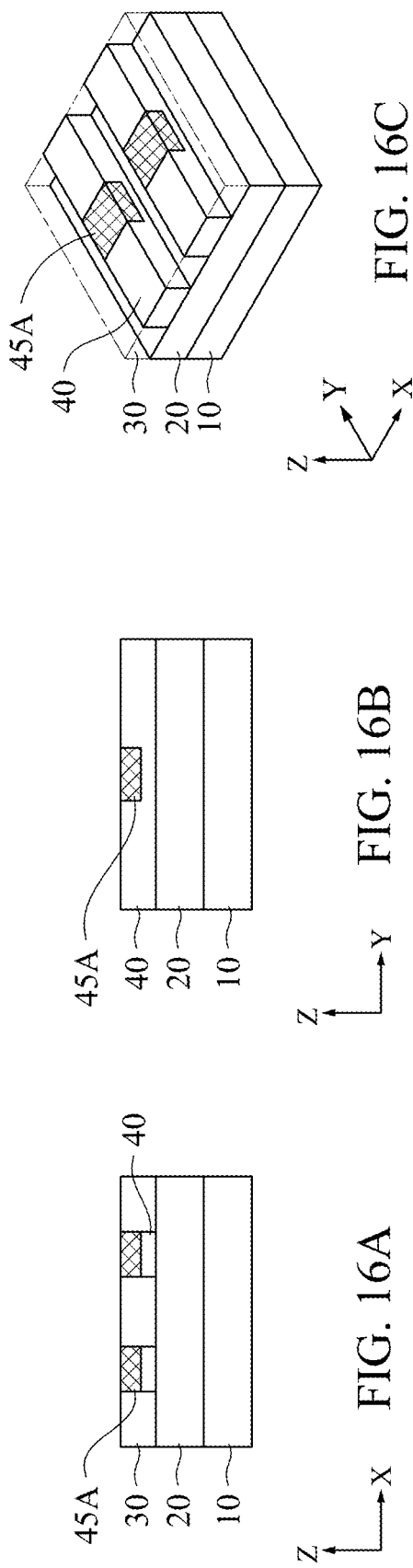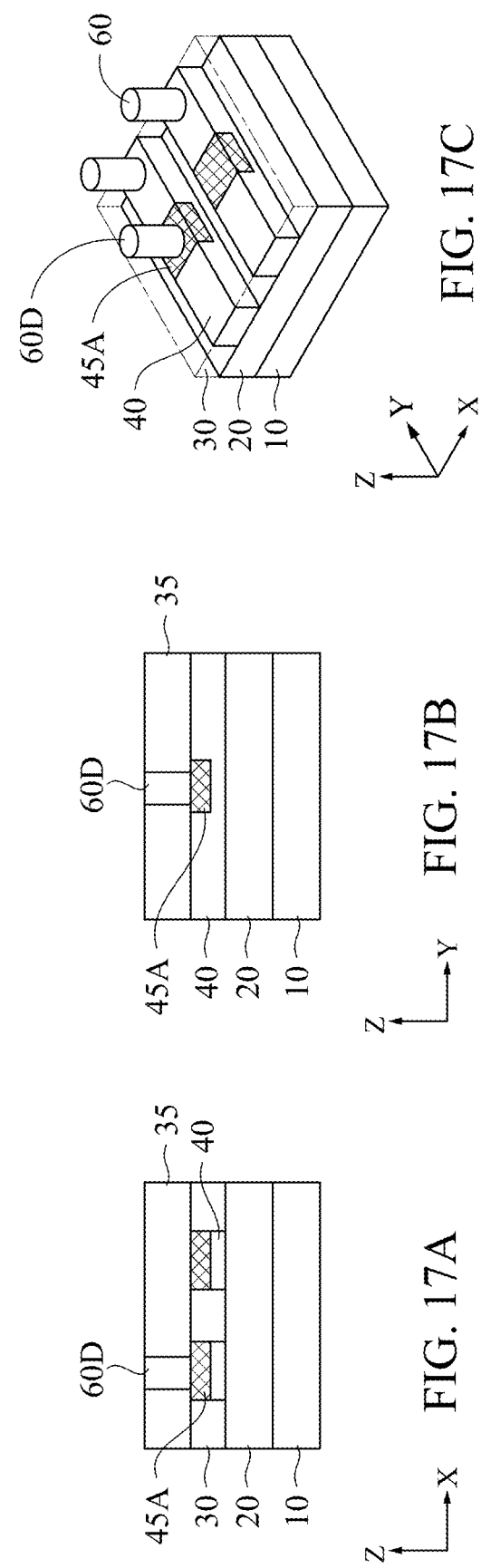

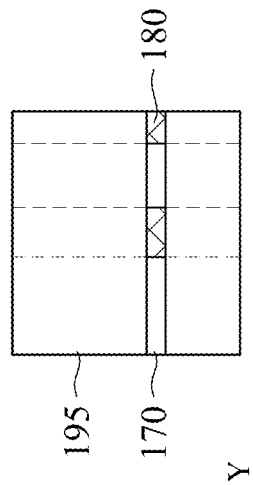
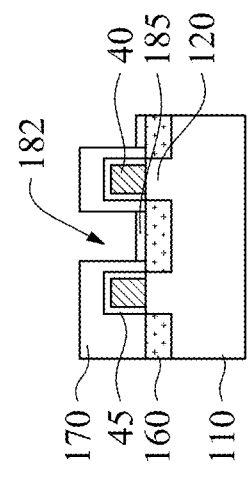
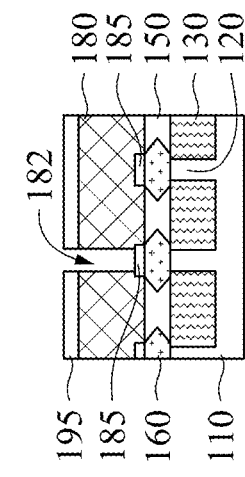
FIG. 20B
FIG. 20C
FIG. 20D
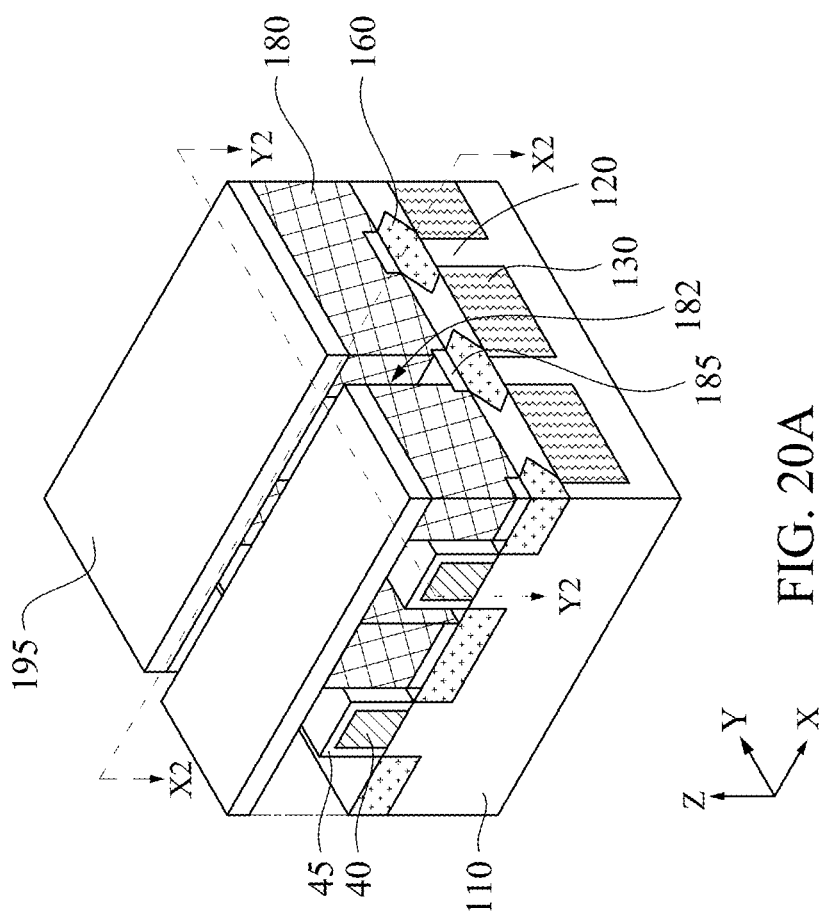
FIG. 20A

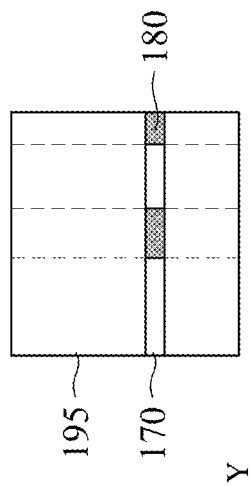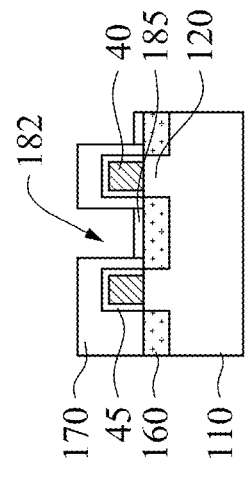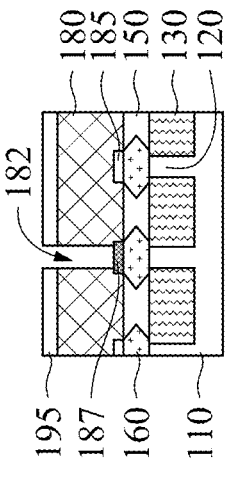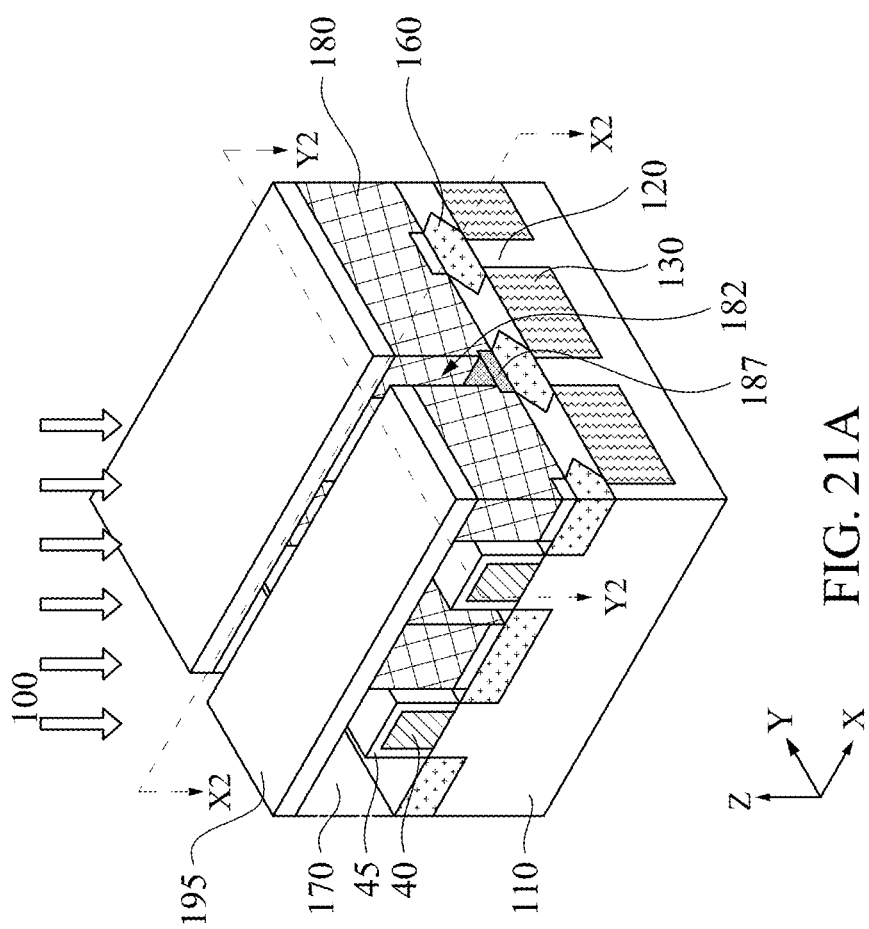

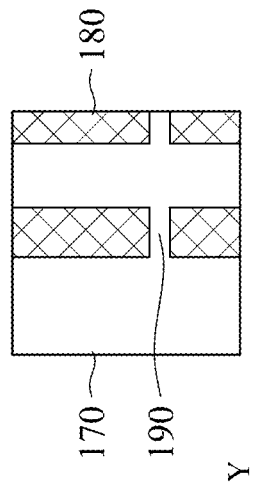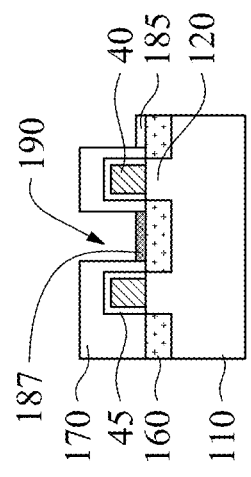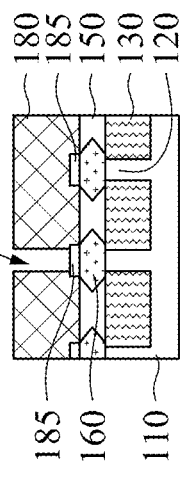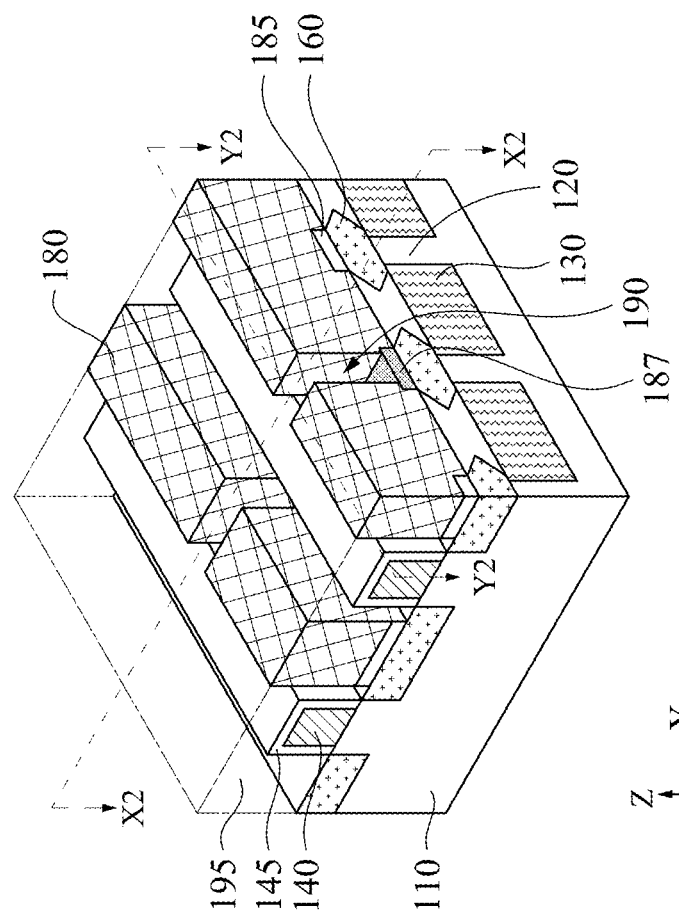

METHOD OF MANUFACTURING SEMICONDUCTOR DEVICES AND SEMICONDUCTOR DEVICES

RELATED APPLICATIONS

This application claims the priority of U.S. Provisional Application No. 63/325,054 filed on Mar. 29, 2022, the entire contents of which application are incorporated herein by reference.

BACKGROUND

Semiconductor devices (integrated circuits) include multiple wiring layers having wiring patterns and via contacts connecting vertically adjacent wiring patterns to achieve complex circuitry functions. In forming a via contact and a metal wiring during semiconductor device fabrication, improved overlay control is desired. A damascene process, in particular, a dual damascene process, is widely used to form a via contact and a metal wiring. However, further improvement in the wiring layer formation process is still required to fabricate advanced semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A, 3B and 3C show views of one of the various stages of a sequential manufacturing operation of a semiconductor device in accordance with embodiments of the present disclosure.

FIGS. 4A, 4B and 4C show views of one of the various stages of a sequential manufacturing operation of a semiconductor device in accordance with embodiments of the present disclosure.

FIGS. 5A, 5B and 5C show views of one of the various stages of a sequential manufacturing operation of a semiconductor device in accordance with embodiments of the present disclosure.

FIGS. 6A, 6B and 6C show views of one of the various stages of a sequential manufacturing operation of a semiconductor device in accordance with embodiments of the present disclosure.

FIGS. 7A, 7B and 7C show views of one of the various stages of a sequential manufacturing operation of a semiconductor device in accordance with embodiments of the present disclosure.

FIGS. 8A, 8B and 8C show views of one of the various stages of a sequential manufacturing operation of a semiconductor device in accordance with embodiments of the present disclosure.

FIGS. 10A, 10B and 10C show views of one of the various stages of a sequential manufacturing operation of a semiconductor device in accordance with embodiments of the present disclosure.

FIGS. 11A, 11B and 11C show views of one of the various stages of a sequential manufacturing operation of a semiconductor device in accordance with embodiments of the present disclosure.

FIGS. 14A, 14B and 14C show views of one of the various stages of a sequential manufacturing operation of a semiconductor device in accordance with embodiments of the present disclosure.

FIGS. 15A, 15B and 15C show views of one of the various stages of a sequential manufacturing operation of a semiconductor device in accordance with embodiments of the present disclosure.

FIGS. 16A, 16B and 16C show views of one of the various stages of a sequential manufacturing operation of a semiconductor device in accordance with embodiments of the present disclosure.

FIGS. 17A, 17B and 17C show views of one of the various stages of a sequential manufacturing operation of a semiconductor device in accordance with embodiments of the present disclosure.

FIGS. 20A, 20B, 20C and 20D show views of the various stages of a sequential manufacturing operation of a semiconductor device in accordance with embodiments of the present disclosure.

FIGS. 21A, 21B, 21C and 21D show views of the various stages of a sequential manufacturing operation of a semiconductor device in accordance with embodiments of the present disclosure.

FIGS. 22A, 22B, 22C and 22D show views of the various stages of a sequential manufacturing operation of a semiconductor device in accordance with embodiments of the present disclosure.

DETAILED DESCRIPTION

Figure 1C:
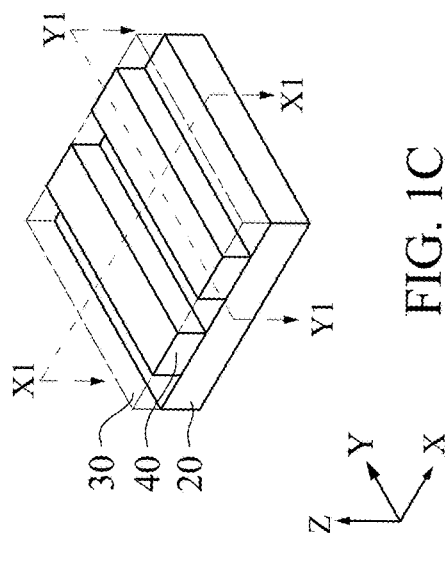
FIGS. 1A, 1B and 1C show views of one of the various stages of a sequential manufacturing operation of a semiconductor device in accordance with embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. The numerical values, ranges, dimensions, material, processes, configurations and/or arrangements described below are mere examples and not limited to those disclosed, and other values, ranges, dimensions, material, processes, configurations and/or arrangements may be within the scope of the present disclosure, unless otherwise explained.

In a semiconductor manufacturing operation, a conductive pattern, which is formed by a deposition and patterning operation or a damascene process, is further cut into pieces to obtain a desired circuit pattern. In such a cutting process, a "to-be-cut portion" needs to be removed physically and completely from its original status and position. In some cases, a target material constituting the to-be-cut portion is difficult to remove by dry and/or wet etching, or difficult to completely removed. The conductive pattern includes, for example, a metallic conductive material, such as Ru (ruthenium having a resistivity of about $10^{-7}$ Ωm) formed over a silicon based structure (e.g., an epitaxial semiconductor layer) or W (tungsten), or an intermediate surface, such as silicide (e.g., $TiSi_2$ having a resistivity of about $10^{-7}$ Ωm) for reducing electrical resistance. Some intermediate materials, such as silicide layers, are difficult to completely remove. If the silicide layer is not completely removed, a remaining thin layer may cause current leakage. In some cases, after the unnecessary portion is cut or removed, a dummy material may be refilled to keep the shape of original structure to avoid collapse or stress damage, and such a dummy filling may need to be fully removed.

In the present disclosure, instead of physically removing the to-be-cut portion, an resistivity conversion process to increase the electrical resistance of or electrically deactivate the to-be-cut portion or the functionally unnecessary portion is provided. In particular, the resistivity conversion process includes a chemical reaction, such as an oxidation process; a physical operation, such as ion implantation or material bombardment; and/or other treatments and combinations thereof to change the electrical behavior thereof.

FIGS. 1A-1C to 8A-8C and FIGS. 8D-8E show various views of the various stages of a sequential manufacturing operation of a semiconductor device in accordance with embodiments of the present disclosure. It is understood that additional operations can be provided before, during, and after processes shown by FIGS. 1A-8E, and some of the operations described below can be replaced or eliminated, for additional embodiments of the method. The order of the operations/processes may be interchangeable. In FIGS. 1A-8C, the "A" figures are cross sectional views along line X1-X1 (along the X direction) of FIG. 1C, the "B" figures are cross sectional views along line Y1-Y1 (along the Y direction) of FIG. 1C, and the "C" figures are perspective views.

In some embodiments, transistors (not shown), such as field effect transistors (FETs), are disposed over a substrate 10. In some embodiments, the FET includes a gate electrode, a source and a drain. In the present disclosure, a source and a drain are interchangeably used and may have the same structure. In some embodiments, the FET is a planar FET, a fin FET (Fin FET) or a gate-all-around (GAA) FET. In some embodiments, one or more interlayer dielectric (ILD) layers 30 are formed over the FETs.

In some embodiments, the substrate 10 is made of a suitable elemental semiconductor, such as silicon, diamond or germanium; a suitable alloy or compound semiconductor, such as Group-IV compound semiconductors (e.g., silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. The substrate 10 includes isolation regions in some embodiments, such as a shallow trench isolation (STI), located between active regions and separating one or more electronic elements from other electronic elements.

In some embodiments, multiple wiring layers $L_x$ (x-th wiring layer) are formed over the FETs, where x is 1, 2, 3, .... Each of the wiring layers $L_x$ includes conductive wiring pattern $M_x$ and via contacts $V_x$ connected above the wiring patterns $M_x$, and each of the wiring layers $L_{x+1}$ ((x+1)-th wiring layer) includes conductive wiring pattern $M_{x+1}$ and via contacts $V_{x+1}$ connected above the wiring patterns $M_{x+1}$. Similarly, the wiring layers $L_{x-1}$ include conductive wiring pattern $M_{x-1}$ and via contacts $V_{x-1}$ connected above the wiring patterns $M_x$-1.

In some embodiments, when the wiring layers $L_x$ include wiring patterns $M_x$ extending in the X direction, the wiring layers $L_{x+1}$ include wiring patterns $M_{x+1}$ extending in the Y direction. In other words, X-direction metal wiring patterns and Y-direction metal wiring patterns are alternately stacked in the vertical direction. In some embodiments, x is up to 20. In some embodiments, the wiring layer $L_1$ includes the closest wiring patterns $M_1$ to the FETs except for local interconnects. Each of the wiring layers $L_x$ also includes one or more ILD layers or inter-metal dielectric (IMD) layers. In other embodiments, the wiring layer includes via contacts formed above the metal wiring patterns.

Figure 1B:
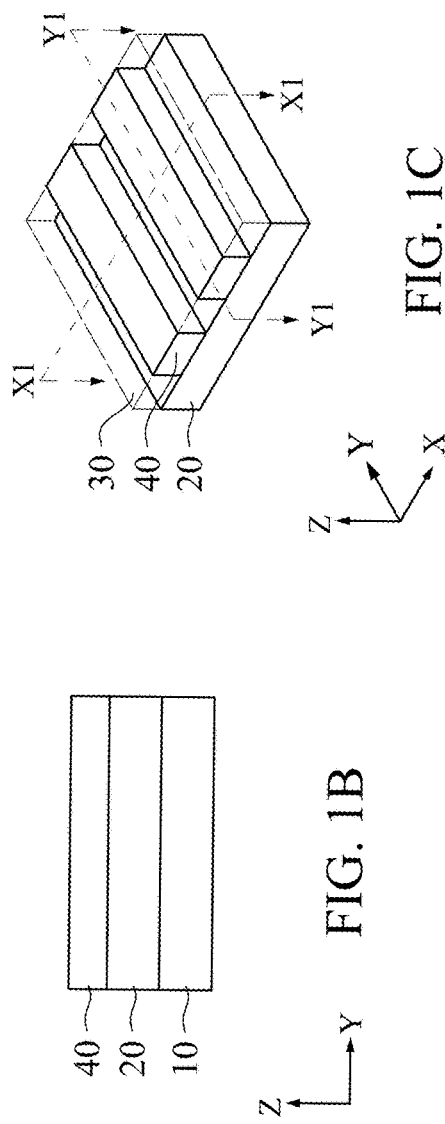
Figure 1A:
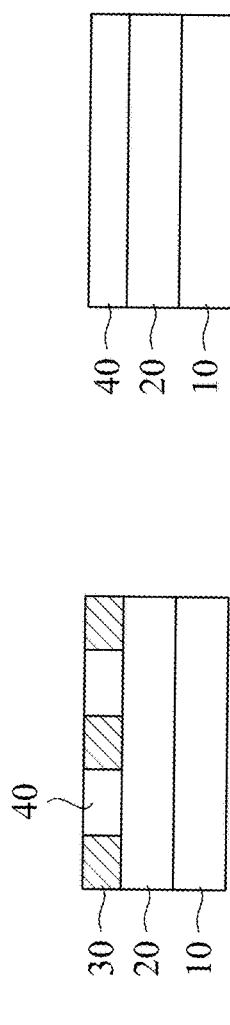

As shown in FIGS. 1A-1C, one or more first wiring patterns (first conductive patterns) 40 extending in the Y direction are formed in a first interlayer dielectric (ILD) layer disposed over an underlying structure 20 disposed over the substrate 10. In some embodiments, the first wiring pattern 40 is formed over the underlying structure 20 and embedded in the first ILD layer 30. The first wiring pattern 40 corresponds to, for example, the wiring layer $M_x$ in some embodiments, or local interconnects directly disposed on the source and/or drain of the FETs.

In some embodiments, the first wiring pattern 40 includes one or more layers of conductive material, such as Cu, Al, Ru, Ir, Mo, Ni, W, Co, Ti or Ta or an alloy thereof including a silicide. In some embodiments, the first wiring pattern 40 is made of Ru or W. In some embodiments, the thickness of the first wiring pattern 40 is in a range from about 20 nm to about 100 nm and is in a range from about 40 nm to about 80 nm in other embodiments. When the first wiring pattern is made of a single metal element, the purity of the metal element is more than 99% in some embodiments. In some embodiments, the purity is less than 100% and the first wiring pattern 40 may include an impurity, such as carbon. In some embodiments, the first wiring pattern 40 is formed by a damascene process. In some embodiments, an upper surface of the first wiring pattern 40 is exposed. In some embodiments, the width along the X direction of the first wiring pattern 40 is in a range from about 5 nm to about 50 nm.

In some embodiments, the first ILD layer 30 includes one or more layers of silicon oxide, SiON, SiOCN, SiCN, SiOC, silicon nitride, an organic material, a low-k dielectric material, or an extreme low-k dielectric material. In some embodiments, the underlying structure 20 includes one or more layers of silicon oxide, SiON, SiOCN, SiCN, SiOC, silicon nitride, an organic material, a low-k dielectric material, or an extreme low-k dielectric material; one or more conductive layers; and/or one or more semiconductor layers.

Figure 2C:
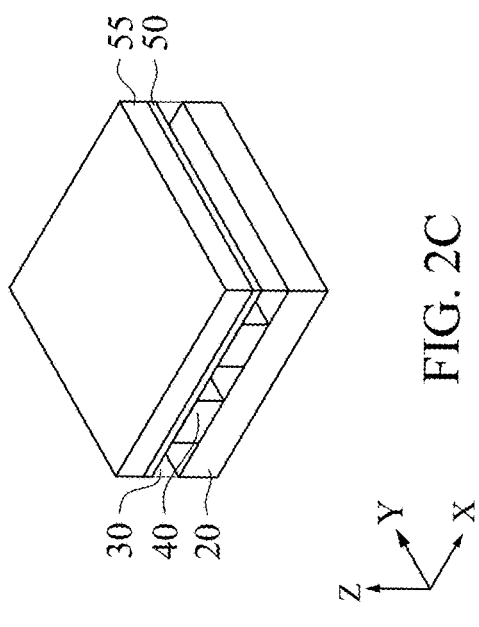
FIGS. 2A, 2B and 2C show views of one of the various stages of a sequential manufacturing operation of a semiconductor device in accordance with embodiments of the present disclosure.
Figure 2B:
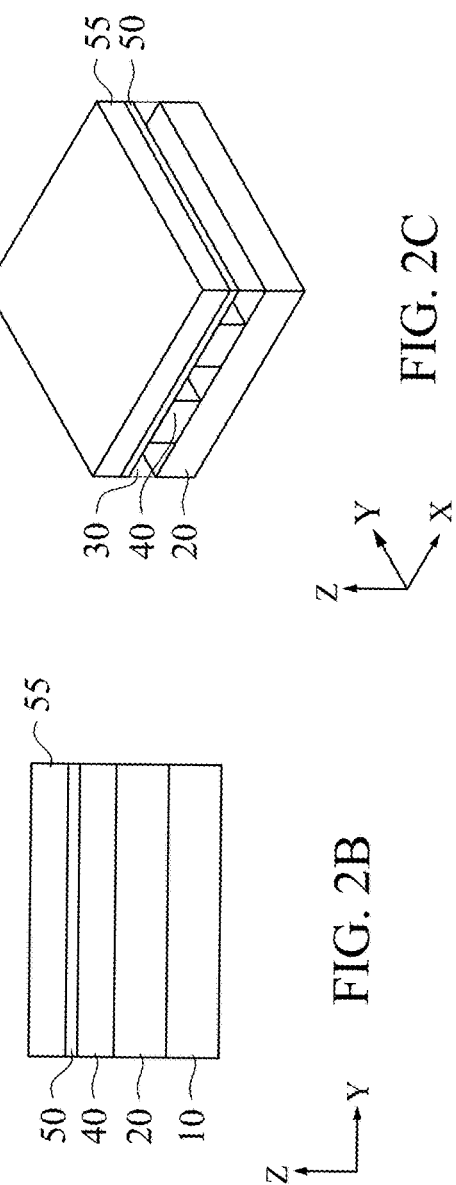
Figure 2A:
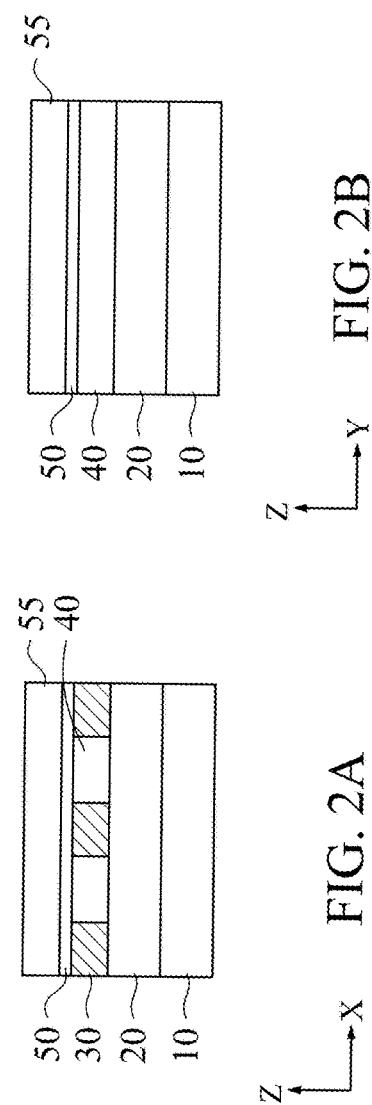

Then, as shown in FIGS. 2A-2C, a hard mask layer 50 is formed over the first wiring pattern 40 and the first ILD layer 30 and a photo resist layer 55 is formed over the hard mask layer 50. In some embodiments, the hard mask layer 50 includes one or more of silicon nitride, silicon carbide, aluminum oxide, titanium nitride (TiN), tantalum nitride (TaN), polysilicon, amorphous silicon or any other suitable material. In some embodiments, TiN is used as the hard mask layer 50.

Next, as shown in FIGS. 3A-3C, a photo resist layer 55 is patterned to form an opening 56 by one or more lithography operations, such as DUV or EUV lithography. Further, the hard mask layer 50 is pattered to form an opening 52 by using the photo resist layer 55 as an etching mask, as shown in FIGS. 4A-4C. Then, in some embodiments, the photo resist layer 55 is removed as shown in FIGS. 5A-5C. As shown in FIGS. 5A-5C, a part of the first wiring pattern 40 to be converted to an increased resistance portion is exposed under the opening 52.

Next, as shown in FIGS. 6A-6C, one or more resistivity conversion processes are performed to increase the resistance of the exposed portion of the first wiring pattern 40 to provide a resistive portion 45. In some embodiments, the resistivity conversion process 100 includes an oxidation process to oxidize the exposed portion (to-be-cut portion) of the first wiring pattern 40 into an oxide portion 45. The resistivity conversion process converts the to-be-cut portion into a high resistance state having a resistivity of about four or more times (e.g. —five times or ten times or more) the resistivity of the first wiring pattern 40 before the resistivity conversion process or of the remaining portion of the first wiring pattern 40 which has not been converted.

In some embodiments, the oxidation process includes a plasma oxidation process using an oxygen containing gas, such as $O_2$. In some embodiments, the oxidation process increases the resistivity of the to-be-cut portion of the first wiring pattern 40 higher than the resistivity of the remaining portion of the first wiring pattern 40 (or the original first wiring pattern before the resistivity conversion process). In some embodiments, when the first wiring pattern 40 is made of Ru (having a resistivity of about $7.2\times10^{-8}$ $\Omega$m), the oxidized portion ($RuO_2$) has a resistivity of about $3.5\times10^{-7}$ $\Omega$m (about 4 times or more). In some embodiments, when the first wiring pattern 40 is made of W (having a resistivity of about $5.6\times10^{-8}$ $\Omega$m), the oxidized portion ($WO_3$) has a resistivity of about $1.1\times10^{-6}$ $\Omega$m (about 18 times or more). The converted (oxidized) portion includes an oxide (or nitride, or carbide) of one or more elements constituting the first wiring pattern 40.

In some embodiments, the oxidization treatment is performed in a range from about 10 min to about 60 min and is performed in a range from about 20 min to about 40 min in other embodiments, depending on the thickness of the first wiring pattern 40 and design and/or process requirements. In some embodiments, input power of the plasma oxidation is in a range from about 100 W to about 200 W depending on the thickness of the first wiring pattern 40 and design and/or process requirements. If the to-be-cut portion of the first wiring pattern is under-treated (insufficient oxidation), there may be a remaining conductive part in the to-be-cut portion of the first wiring pattern 40, and if the to-be-cut portion of the first wiring pattern is overtreated, the treatment may cause damage on the hard mask layer 50 and/or the first ILD layer 30. FIGS. 7A-7C show the structure after the to-be-cut portion of the first wiring pattern 40 is completely oxidized to form an oxide layer 45.

In some embodiments, the resistivity conversion process includes an ion implantation operation. In some embodiments, the ion implantation operation includes oxygen ion implantation. In some embodiments, the oxygen ion implantation is performed at an acceleration voltage in a range from about 1 keV to 20 keV. In some embodiments, the oxygen ion implantation increases the resistivity of the to-be-cut portion of the first wiring pattern 40 higher (four times or more) than the resistivity of the remaining portion of the first wiring pattern 40 (or the original first wiring pattern before the resistivity conversion process). In some embodiments, after the oxygen ion implantation process, an annealing operation is performed to convert the oxygen implanted portion into oxide.

In some embodiments, the ion implantation operation includes nitrogen ion implantation, carbon ion implantation, or any other ion implantation that increases the resistivity of the material constituting the first wiring pattern higher by more than about 4 times. In some embodiments, the nitrogen ion implantation forms a nitride portion and the carbon ion implantation forms a carbide portion, with or without the annealing operation.

Figure 8E:
FIGS. 8D and 8E show views of one of the various stages of a sequential manufacturing operation of a semiconductor device in accordance with embodiments of the present disclosure.
Figure 8D:

After the resistivity conversion operation, the hard mask layer 50 is removed as shown in FIGS. 8A-8C. In some embodiments, without removing the oxidized portion 45, a second ILD layer is formed over the first wiring pattern 40, the oxidized portion 45 and the first ILD layer 30 as shown in FIGS. 8D and 8E. In some embodiments, no additional planarization operation is performed between the resistivity conversion operation and the second ILD formation. In some embodiments, the length of the oxidized portion 45 along the Y direction is in a range from about 10 nm to about 10 μm, and is in a range from about 100 nm to about 1 μm in other embodiments. Since the resistivity of the high resistance portion 45 is sufficiently high so that substantially no current flows through the high resistance portion 45, the first wiring pattern 40 is electrically divided into two portions 40A, and 40B as shown in FIG. 8C. Here, "substantially no current" means a current value less than 10% of the current flow value when no high resistance portion is formed (i.e., the current flowing through the original first wiring pattern).

In some embodiments, the hard mask layer 50 is at least partially (e.g., the surface region) oxidized, and the oxidized hard mask layer is subsequently removed as set forth above. In some embodiments, the resistivity conversion operation 100 is performed with the photo resist layer 55 remaining. In such a case, the photo resist layer 55 is damaged or at least partially removed, and the damaged photo resist layer is subsequently removed. In some embodiments, no hard mask layer is used and the photo resist pattern 55 is formed over the first ILD layer.

FIGS. 9A-9C to 12A-12C and FIGS. 13A-14C show various views of the various stages of a sequential manufacturing operation of a semiconductor device in accordance with embodiments of the present disclosure. It is understood that additional operations can be provided before, during, and after processes shown by FIGS. 9A-14C, and some of the operations described below can be replaced or eliminated, for additional embodiments of the method. The order of the operations/processes may be interchangeable. In FIGS. 9A-12C, the "A" figures are cross sectional views along line X1-X1 (along the X direction) of FIG. 9C, the "B" figures are cross sectional view along line Y1-Y1 (along the Y direction) of FIG. 9C, and the "C" figures are perspective views. Materials, processes, configurations and/or dimensions as explained with respect to the above embodiments are applicable to the following embodiments, and detailed explanation thereof may be omitted.

Figure 9C:
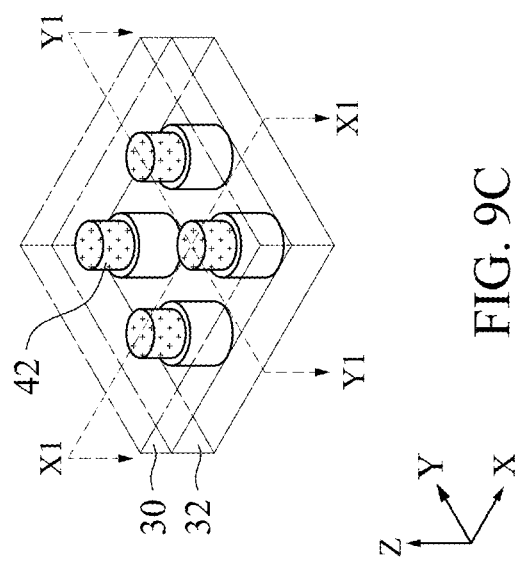
FIGS. 9A, 9B and 9C show views of one of the various stages of a sequential manufacturing operation of a semiconductor device in accordance with embodiments of the present disclosure.
Figure 9B:
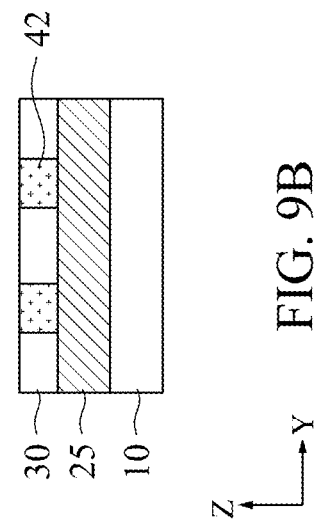
Figure 9A:
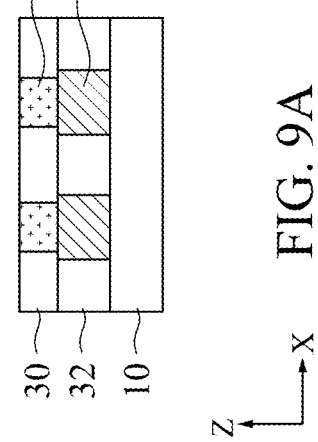

In some embodiments, a pattern to be converted into a high resistance portion is a via contact or an island pattern among via contacts which connect a lower wiring pattern and an upper wiring pattern. As shown in FIGS. 9A-9C, initial via contacts 42 are formed in the first ILD layer 30. In some embodiments, the initial via contacts 42 are embedded in the first ILD layer 30. In some embodiments, the initial via contacts 42 are formed over lower wiring patterns 25 formed and/or embedded in a lower ILD layer 32, as shown in FIGS. 9A and 9B. The lower wiring patterns 25 are omitted in FIG. 9C. In some embodiments, the initial via contacts 42 are made of conductive material, such as Cu, Al, Ru, Jr, Mo, Ni, W, Co, Ti, Ta or an alloy thereof. In some embodiments, the initial via contact 42 is made of W. The lower wiring patterns 25 extend in the Y direction and are made of conductive material, such as Cu, Al, Ru, Jr, Mo, Ni, W, Co, Ti or Ta or an alloy thereof. In some embodiments, the initial via contacts 42 are formed in a matrix (N rows and M columns, where N and M are natural numbers, or staggered (hexagonal) matrix). In some embodiments, all via contacts of the matrix are formed.

Then, similar to the operations of FIGS. 2A-6C, a hard mask pattern 50 is formed and the resistivity conversion operation 100 is performed to increase the resistance of one or more of the initial via contacts 42, as shown in FIG. 10C. Then, the hard mask pattern 50 is removed as shown in FIGS. 11A-11C. In some embodiments, the entirety of the initial via contact is fully converted (e.g., oxidized) as shown in FIGS. 11A-11C. As shown in FIGS. 11A and 11B, although one or more high resistance via contacts 47 are formed in contact with the lower wiring patterns 25, because the resistivity of the high resistance via contact 47 is sufficiently high, substantially no current flows through the high resistance via contact. Here, "substantially no current" means a current value less than 10% of the current flow value when no high resistance portion is formed.

Figure 12A:
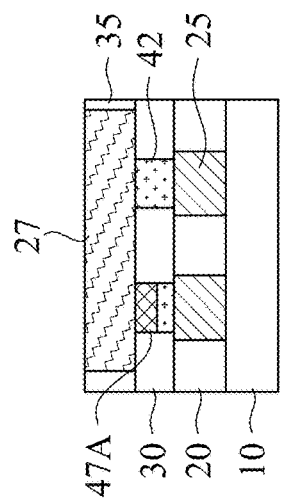
FIGS. 12A, 12B and 12C show views of one of the various stages of a sequential manufacturing operation of a semiconductor device in accordance with embodiments of the present disclosure.
Figure 12B:
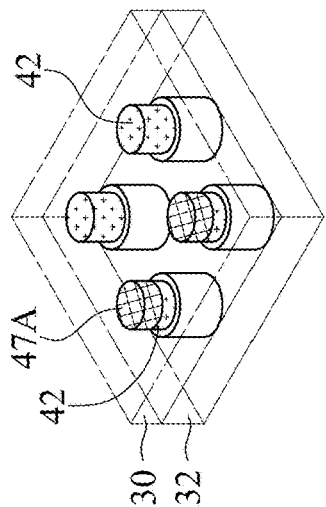
Figure 12C:
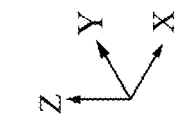

In some embodiments, as shown in FIGS. 12A-12C, only an upper portion of the initial via contacts 42 is converted (oxidized) to have a high resistivity as a high resistance portion 47A. In some embodiments, the thickness of the upper portion is about 10% to about 50% of the initial thickness of the via contact 42 (or the thickness of the via contact that is not oxidized). In some embodiments, thickness of the via contact 42 before or without the resistivity conversion operation is in a range from about 20 nm to about 80 nm and is in a range from about 40 nm to about 60 nm depending on the design and/or process requirements. In some embodiments, the number of the fully converted or partially converted via contacts is at least 10 per 100 µm².

Figure 13A:
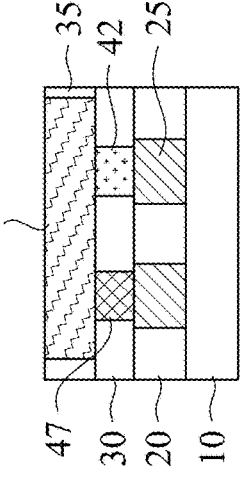
FIGS. 13A, 13B and 13C show views of one of the various stages of a sequential manufacturing operation of a semiconductor device in accordance with embodiments of the present disclosure.
Figure 13B:
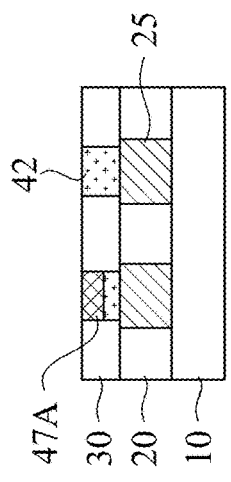
Figure 13C:
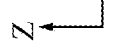
Figure 18B:
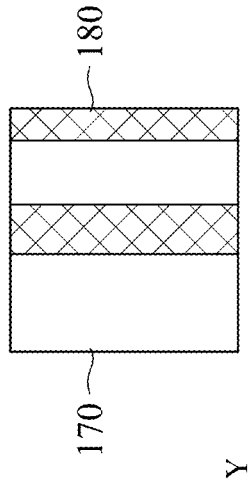
FIGS. 18A, 18B, 18C and 18D show views of the various stages of a sequential manufacturing operation of a semiconductor device in accordance with embodiments of the present disclosure.
Figure 18C:
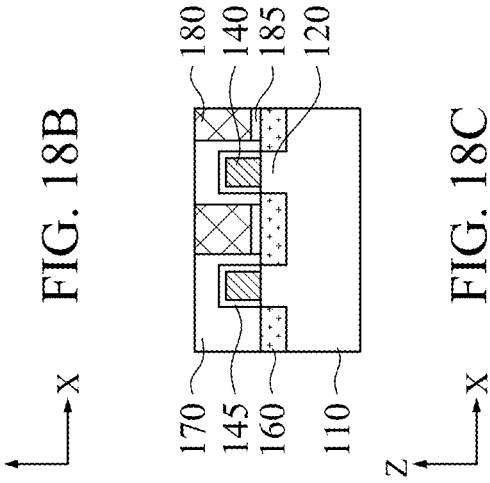
Figure 18D:
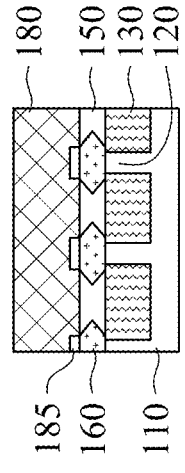
Figure 18A:
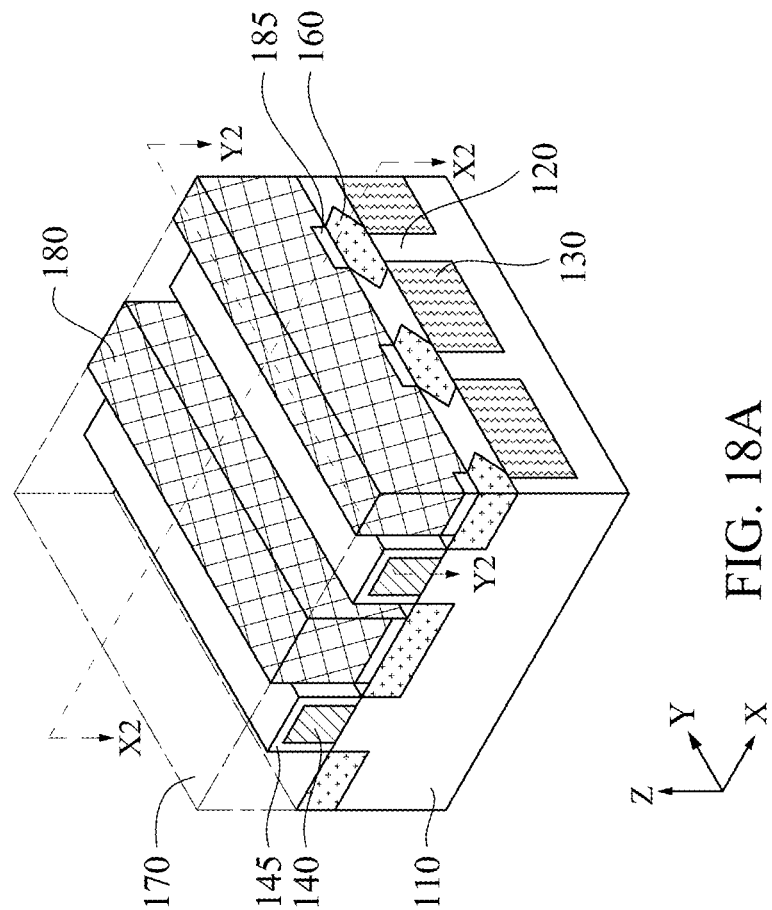
Figure 19B:
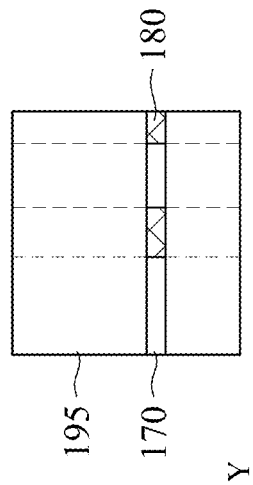
FIGS. 19A, 19B, 19C and 19D show views of the various stages of a sequential manufacturing operation of a semiconductor device in accordance with embodiments of the present disclosure.
Figure 19C:
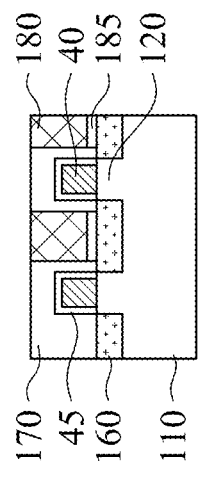
Figure 19D:
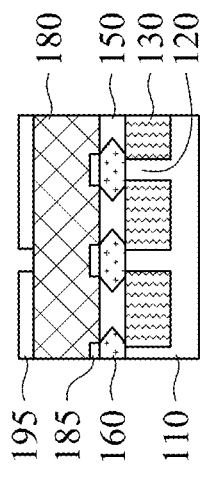
Figure 19A:
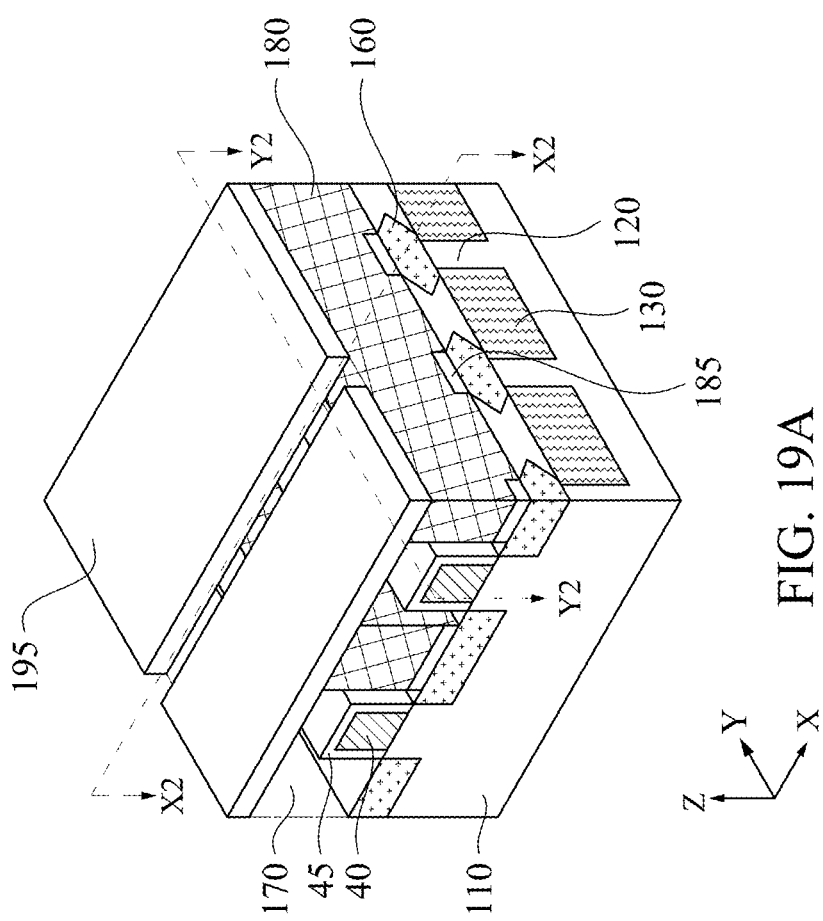

In some embodiments, as shown in FIG. 13A, no upper wiring pattern is formed over the partially or fully converted via contacts and the upper surface of the partially or fully converted via contact is in contact with or fully covered by the second ILD layer 35. In other embodiments, as shown in FIGS. 13B and 13C, an upper wiring pattern 27 is formed in contact with the upper surface of the partially or fully converted via contacts. Since the resistivity of the converted via contact 47 or the partially converted portion 47A is sufficiently high, current does not flow through the converted via contact between the lower wiring pattern 25 and the upper wiring pattern 27. In some embodiments, as shown in FIGS. 14A-14C, no lower wiring pattern is formed below the converted via contact 47 or the partially converted via contact.

FIGS. 15A-17C show various views of the various stages of a sequential manufacturing operation of a semiconductor device in accordance with embodiments of the present disclosure. It is understood that additional operations can be provided before, during, and after processes shown by FIGS. 15A-17C, and some of the operations described below can be replaced or eliminated, for additional embodiments of the method. The order of the operations/processes may be interchangeable. In FIGS. 15A-17C, the "A" figures are cross sectional views along line X1-X1 (along the X direction) of FIG. 15C, the "B" figures are cross sectional views along line Y1-Y1 (along the Y direction) of FIG. 15C, and the "C" figures are perspective views. Materials, processes, configurations and/or dimensions as explained with respect to the above embodiments are applicable to the following embodiments, and detailed explanation thereof may be omitted.

In some embodiments, as shown in FIGS. 15A-15C, the resistivity conversion operation 100 converts (e.g., oxidizes) only an upper portion of the to-be-cut portion of the first wiring pattern 40 to provide a high resistivity portion 45A. In some embodiments, the thickness of the upper portion is about 10% to about 50% of the initial thickness of the first wiring pattern 40 (or the thickness of the first wiring pattern that is not converted). After the resistivity conversion operation, the hard mask layer 50 is removed as shown in FIGS. 16A-16C.

In some embodiments, one or more upper via contacts 60 are formed over the conductive portions (not-converted portions) of the first wiring pattern 40, and one or more dummy via contacts 60D are formed over the converted portion 45A of the first wiring patterns. In some embodiments, the dummy via contacts 60D are formed over the fully converted portion 45, 47 shown in FIGS. 8C and 11C.

In some embodiments, the via contact 60 and the dummy via contact 60D are made of the same material, such as Cu, Al, Ru, Ir, Mo, Ni, W, Co, Ti or Ta or an alloy thereof. In some embodiments, the via contact 60 and the dummy via contact 60D are formed in a matrix (N rows and M columns, where N and M are natural numbers, or staggered (hexagonal) matrix).

As shown in FIGS. 17A-17C, since the first wiring pattern 40 is only partially converted to have a higher resistance at the upper portion thereof, a current can flow through the lower portion thereof in the Y direction. Further, substantially no current vertically flows through the dummy via contact 60D because of the converted portion 45A. Here, "substantially no current" means a current value less than 10% of the current flow value when no converted portion is formed.

FIGS. 18A-18D to 22A-22D show various views of the various stages of a sequential manufacturing operation of a semiconductor device in accordance with embodiments of the present disclosure. It is understood that additional operations can be provided before, during, and after processes shown by FIGS. 18A-22D, and some of the operations described below can be replaced or eliminated, for additional embodiments of the method. The order of the operations/processes may be interchangeable. In FIGS. 18A-22D, the "A" figures are perspective views, the "B" figures are plan (top) views, the "C" figures are cross sectional views along line X2-X2 (along the X direction) of the "A" figures, and the "D" figures are cross sectional view along line Y2-Y2 (along the Y direction) of the "A" figures. Materials, processes, configurations and/or dimensions as explained with respect to the above embodiments are applicable to the following embodiments, and detailed explanation thereof may be omitted.

FIGS. 18A-18D show a structure where a fin structure 120, an isolation insulating layer 130, a gate structure 140, gate sidewall spacer 145, a source/drain epitaxial layer 160, a first ILD layer 150, a second ILD layer 170, a silicide layer 185, and a source/drain contact bar 180 are formed over a substrate 110. The substrate 110 is consistent with the substrate 10 as set forth above, and is made of Si in some embodiments.

In some embodiments, the gate structure 140 is a metal gate structure including a gate dielectric layer, one or more work function adjustment material layers and a main metal gate electrode layer. The gate dielectric layer includes one or more layers of metal oxides such as a high-k metal oxide. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. The main metal gate electrode includes one or more layers of metal material, such as Al, Cu, W, Ti, Ta, TIN, TiAl, TiAlC, TiAlN, TaN, NiSi, CoSi, and other conductive materials. The work function adjustment layers are made of a conductive material, such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TIN, TiC and Co is used as the work function adjustment layer.

In some embodiments, a cap insulating layer is disposed over the metal gate electrode. The cap insulating layer includes one or more layers of insulating material, such as a silicon nitride based material including SiN, SiCN and SiOCN. The first and second ILD layers includes one or more layers of an insulating material, such as a silicon oxide based material, such as silicon dioxide ($SiO_2$), SiON, SiCO or SiOCN, or other low-k materials.

The gate sidewall spacer 145 is made of a different material than the cap insulating layer and includes one or more layers of insulating material, such as a silicon nitride based material including SiN, SiON, SiCN and SiOCN. The material of the sidewall spacer 145, the material of the cap insulating layer, and a material of the first ILD layer 150 are different from each other, so that each of these layers can be selectively etched. In one embodiment, the sidewall spacer 145 is made of SiOCN, SiCN or SiON, the cap insulating layer is made of SiN, and the first ILD layer 150 is made of $SiO_2$.

The source/drain contact bar 180 is formed in a trench formed in the second ILD layer 170 to contact the silicide layers 185 of adjacent source/drain epitaxial layers 160. In some embodiments, the source/drain contact bar 180 is made of Ru, Co, Ni, W, Ir or alloy thereof or any other suitable conductive material. In some embodiments, the upper surface of the source/drain contact bar 180 is exposed from and flush with the upper surface of the second ILD layer 170.

Then, as shown in FIGS. 19A-19D, a hard mask layer 195 is formed over the second ILD layer 170 and the source/drain contact bar 180. The hard mask layer 195 includes an opening or a slit over the silicide layer 185 to be converted. In some embodiments, the hard mask layer 195 includes one or more dielectric materials (e.g., silicon nitride, aluminum oxide, hafnium oxide, zirconium oxide, etc) or one or more metal or metal nitride layers, such as Ta, Ti, TaN or TiN. In some embodiments, TiN is used as the hard mask layer 195.

Next, as shown in FIGS. 20A-20D, the source/drain contact bar 180 is patterned by using the hard mask layer 195 as an etching mask to form a trench or an opening 182. The silicide layer 185 to be converted is fully or at least partially exposed at the bottom of the opening 182.

Then, as shown in FIGS. 21A-21D, a resistivity conversion operation 100 is performed to convert the exposed silicide layer 185 at the bottom of the opening 182 to a high resistance portion 187. In some embodiments, a plasma oxidation operation is performed as the resistivity conversion operation and an oxide of the elements constituting the silicide layer is formed. The silicide layer 185 is converted to the high resistance portion 187 by the resistivity conversion operation. The resistance of the converted silicide layer (oxide layer) is about $10^4$ to $10^9$ times the resistance of the silicide layer 185 before the resistivity conversion operation. When the silicide layer 185 is $TiSi_2$, the oxide layer includes silicon oxide and titanium oxide or $SiTiO_x$. Any other resistivity conversion operations as explained above can be used to convert the silicide layer 185 to the high resistance portion 187. In some embodiments, a surface roughness Ra of the oxide layer is greater than a surface roughness Ra of the first and third silicide layers.

After the resistivity conversion operation, the hard mask layer 195 is removed, as shown in FIGS. 22A-22D, and the opening 182 is filled by one or more dielectric materials 190 which is different from the oxide of the high resistance portion. In some embodiments, the dielectric layer 190 includes silicon oxide, silicon nitride, SiON, SiCN, SiOC or SiOCN, and does not include the metal element (e.g., Ti, Ni, W, etc.) constituting the silicide layer.

Figure 23C:
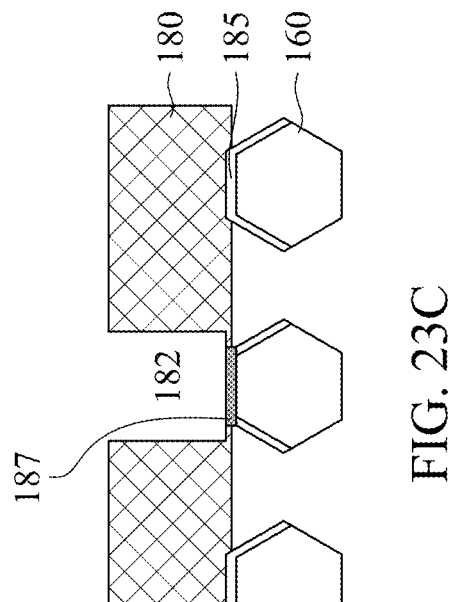
FIGS. 23A, 23B and 23C show views of the various stages of a sequential manufacturing operation of a semiconductor device in accordance with embodiments of the present disclosure.
Figure 23A:
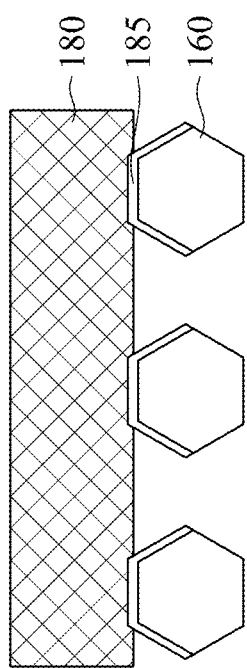
Figure 23B:
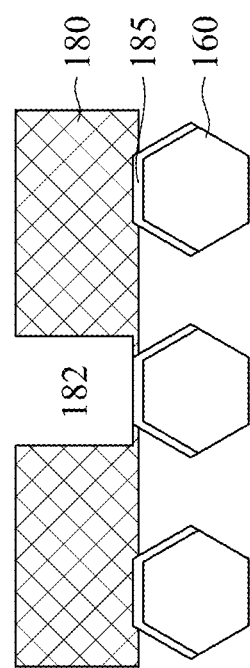

FIGS. 23A-23C shows enlarged views of the source/drain regions explaining more details of the silicide conversion operation. As shown in FIG. 23A, the source/drain contact bar 180 is in contact with the silicide layer 185. In some embodiments, the source/drain contact bar 180 is not in direct contact with the source/drain epitaxial layer 160.

Then, the opening 182 is formed as shown in FIG. 23B. The silicide layer 185 is exposed at the bottom of the opening 182. In some embodiments, the source/drain contact bar 180 is still in contact with the silicide layer 185 as shown in FIG. 23B.

After the resistivity conversion operation, the high resistance portion 187 is formed to electrically separate the adjacent source/drain contact bars as shown in FIG. 23C so that substantially no current flows between the adjacent source/drain contact bars.

In the silicide layer conversion operation, the conductive silicide layer is converted to the non-conductive or high resistance portion by, for example, oxidation. Since a silicide layer is generally difficult to remove by dry and/or wet etching operations, the resistivity conversion can electrically separate two adjacent conductive regions more effectively.

Figure 24A:
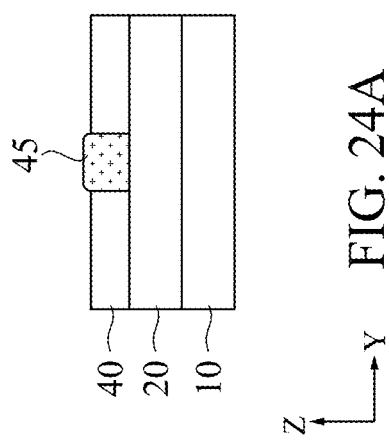
FIGS. 24A, 24B and 24C show views of the various stages of a sequential manufacturing operation of a semiconductor device in accordance with embodiments of the present disclosure.

In some embodiments, after the to-be-cut portion of the first wiring pattern 40 is oxidized by the resistivity conversion operation (becoming an oxide layer 45), the thickness of the oxide layer 45 is greater than the thickness of the first wiring pattern 40 as shown in FIG. 24A. In some embodiments, the thickness of the oxide layer 45 is about 5% to about 20% greater than the thickness of the first wiring pattern 40. In some embodiments, the width of the oxide layer 45 is substantially the same as the width of the first wiring pattern 40 (±5%).

Figure 24C:
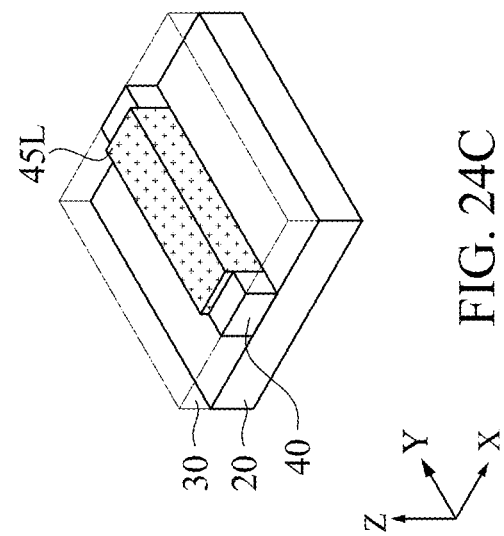
Figure 24B:
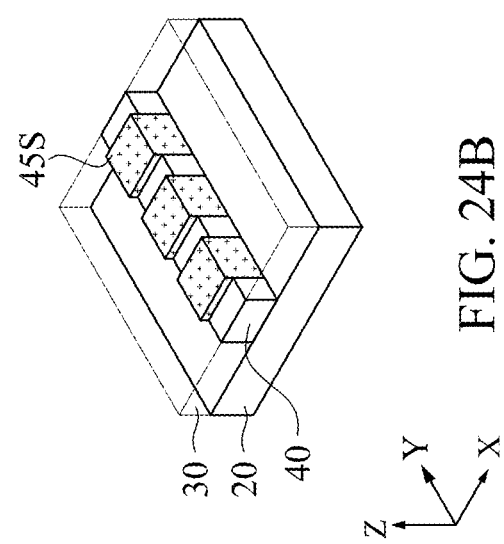

In some embodiments, multiple high resistance portions 45S are formed to electrically separate the first wiring pattern 40 as shown in FIG. 24B. In such a case, one or more conductive portions, which are electrically floating, are formed between active first wiring patterns which are electrically coupled to other circuit elements. In some embodiments, the width of the high resistance portions 45S along the Y direction is in a range from about 5 nm to about 50 nm.

Further, in some embodiments, as shown in FIG. 24C, a long high resistance portion 45L is formed to electrically separate the first wiring pattern 40. In some embodiments, the width of the long high resistance portions 45L along the Y direction is in a range from about 100 nm to about 1000 nm. In some embodiments, the semiconductor device includes one or more short high resistance portions 45S and one or more long high resistance portions 45L in the same wiring layer.

Further, in some embodiments, as shown in FIG. 24C, a long high resistance portion 45L is formed to electrically separate the first wiring pattern 40. In some embodiments, the width of the high resistance portions 45S along the Y direction is in a range from about 100 nm to about 1000 nm. In some embodiments, the semiconductor device includes one or more short high resistance portions 45S and one or more long high resistance portions 45L in the same wiring layer.

In the foregoing embodiments, a to-be-cut portion or an unnecessary portion of a conductive pattern is electrically inactivated by a resistivity conversion operation, such as plasma oxidation. Accordingly, it is not necessary to re-fill the cut or removed portion which becomes an opening or a space. Further, instead of forming only necessary patterns (e.g., via contacts) by a patterning operation, a matrix of patterns is formed and then some of the patterns are deactivated by the resistivity conversion operation, which is more process friendly and increases process margins. In addition, since a silicide layer is converted by oxidation instead of directly etching the silicide layer, it is possible to electrically separate two adjacent conductive regions more effectively.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a conductive pattern is formed in a surface region of a dielectric layer, a mask pattern including an opening over the conductive pattern is formed over the dielectric layer, a part of the conductive pattern is converted into a high-resistant part having a higher resistivity than the conductive pattern before the converting through the opening, and the mask pattern is removed. In one or more of the foregoing or following embodiments, the conductive pattern is made of Ru, W or silicide. In one or more of the foregoing or following embodiments, the part of the conductive pattern is converted to oxide. In one or more of the foregoing or following embodiments, the part of the conductive pattern is converted to oxide by plasma oxidization. In one or more of the foregoing or following embodiments, the mask pattern is at least partially oxidized or ashed. In one or more of the foregoing or following embodiments, an upper portion of the part of the conductive pattern is converted to high-resistant and a lower portion of the part of the conductive pattern remain conductive. In one or more of the foregoing or following embodiments, the part of the conductive pattern is converted to high-resistant from an upper surface to a bottom surface. In one or more of the foregoing or following embodiments, an adjacent part of the conductive pattern adjacent to the part of the conductive pattern that is converted to high-resistant remains conductive. In one or more of the foregoing or following embodiments, a resistivity of the high-resistant part is 4 times or more a resistivity of conductive part. In one or more of the foregoing or following embodiments, an entirety of the conductive pattern is converted to high-resistant.

In accordance with another aspect of the present disclosure, in a method of manufacturing a semiconductor device, a conductive pattern is formed in a trench formed in a dielectric layer, a mask pattern including an opening over the conductive pattern is formed over the dielectric layer, a part of the conductive pattern is converted into a high-resistant part having a higher resistivity than the conductive pattern before the converting through the opening, the mask pattern is removed, and a first via is formed on a conductive part of the conductive pattern and a second via is formed on the high-resistant part. In one or more of the foregoing or following embodiments, the conductive pattern is made of Ru or W. In one or more of the foregoing or following embodiments, the part of the conductive pattern is converted to oxide by plasma oxidization. In one or more of the foregoing or following embodiments, the mask pattern includes TiN, and the mask pattern is at least partially oxidized. In one or more of the foregoing or following embodiments, an upper portion of the part of the conductive pattern is converted to high-resistant and a lower portion of the part of the conductive pattern remain conductive. In one or more of the foregoing or following embodiments, a thickness of the conductive pattern is in a range from 20 nm to 80 nm.

In accordance with another aspect of the present disclosure, in a method of manufacturing a semiconductor device, a first source/drain epitaxial layer is formed over a first fin structure, a second source/drain epitaxial layer is formed over a second fin structure and a third source/drain epitaxial layer is formed over a third fin structure. A first silicide layer is formed over the first source/drain epitaxial layer, a second silicide layer is formed over the second source/drain epitaxial layer and a third silicide layer is formed over the third source/drain epitaxial layer. A first dielectric layer is formed. A conductive pattern connecting the first, second and third silicide layers is formed. The conductive pattern is patterned to form an opening over the second silicide layer. The second silicide layer is converted into an oxide layer through the opening. A second dielectric layer is formed over the oxide layer by filling the opening. In one or more of the foregoing or following embodiments, the first, second and third silicide layer includes TiSi. In one or more of the foregoing or following embodiments, the conductive pattern includes Ru, and the conductive pattern is patterned by using a TiN hard mask. In one or more of the foregoing or following embodiments, the TiN hard mask is at least partially oxidized.

In accordance with another aspect of the present disclosure, a semiconductor device includes a first dielectric layer, a first conductive pattern and a second conductive pattern embedded in the first dielectric layer, and an oxide layer connecting the first conductive pattern and the second conductive pattern. The oxide layer includes an oxide of an element constituting the first and second conductive patterns. In one or more of the foregoing or following embodiments, the element is Ru. In one or more of the foregoing or following embodiments, the element is W. In one or more of the foregoing or following embodiments, a thickness of the oxide layer is equal to or greater than a thickness of the first and second conductive patterns.

In accordance with another aspect of the present disclosure, a semiconductor device includes a first dielectric layer, a first conductive pattern and a second conductive pattern embedded in the first dielectric layer and extending in a first direction, a second dielectric layer disposed over the first dielectric layer, a third conductive pattern disposed over the second dielectric layer, a first via contact disposed in the second dielectric layer and physically and electrically connecting the first conductive pattern and the third conductive pattern, and a second via contact disposed in the second dielectric layer. The second via contact includes an oxide layer including an oxide of an element constituting the first via contact. In one or more of the foregoing or following embodiments, the element is W. In one or more of the foregoing or following embodiments, the second via contact further includes a W layer below the oxide layer. In one or more of the foregoing or following embodiments, an entirety of the second via contact is W oxide. In one or more of the foregoing or following embodiments, the second via contact is physically connected to at least one of the second conductive pattern and the third conductive pattern. In one or more of the foregoing or following embodiments, a bottom of the second via contact is in contact with the first dielectric layer. In one or more of the foregoing or following embodiments, the semiconductor device further includes a third dielectric layer disposed over the second dielectric layer, and a top of the second via contact is in contact with the third dielectric layer. In one or more of the foregoing or following embodiments, the second via contact is physically connected to the second conductive pattern and the third conductive pattern. In one or more of the foregoing or following embodiments, a thickness of the first via contact is in a range from 40 nm to 60 nm.

In accordance with another aspect of the present disclosure, a semiconductor device includes a first source/drain epitaxial layer disposed over a first fin structure, a second source/drain epitaxial layer disposed over a second fin structure and a third source/drain epitaxial layer disposed over a third fin structure, a first silicide layer disposed over the first source/drain epitaxial layer and a third silicide layer disposed over the third source/drain epitaxial layer, an oxide layer disposed over the second source/drain epitaxial layer, a first conductive pattern connected to the first silicide layer and the oxide layer, and a second conductive pattern connected to the oxide layer and the third silicide layer. The oxide layer includes oxide of one or more elements constituting the first and third silicide layers. In one or more of the foregoing or following embodiments, the first and third silicide layers includes TiSi, and the oxide layer includes silicon oxide. In one or more of the foregoing or following embodiments, the oxide layer further includes titanium oxide. In one or more of the foregoing or following embodiments, the oxide layer further includes titanium nitride. In one or more of the foregoing or following embodiments, the first and second conductive patterns are made of Ru. In one or more of the foregoing or following embodiments, an upper surface of the oxide layer is higher than an upper surface of the first and third silicide layers. In one or more of the foregoing or following embodiments, a surface roughness Ra of the oxide layer is greater than a surface roughness Ra of the first and third silicide layers.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a conductive pattern having a first resistivity in a first main surface of a dielectric layer,
    wherein the dielectric layer includes one or more of silicon oxide, SiON, SiOCN, SiCN, SiOC, silicon nitride, and an organic material, and
    the conductive pattern has a first main surface coplanar to the first main surface of the dielectric layer,
    forming a mask pattern over the first main surface of the dielectric layer, the mask pattern including an opening over the first main surface of the conductive pattern;
    converting a part of the conductive pattern into a high-resistance part having a second resistivity higher than the first resistivity;
    removing the mask pattern;
    forming a first conductive via in contact with and on a conductive part of the first main surface of the conductive pattern; and
    forming a second conductive via in contact with and on the high-resistance part,
    wherein a portion of the second conductive via contacting the high-resistance part is electrically conductive.

2. The method of claim 1, wherein the conductive pattern is made of Ru, W or a silicide.

3. The method of claim 2, wherein the part of the conductive pattern is converted to an oxide.

4. The method of claim 2, wherein the part of the conductive pattern is converted to an oxide by plasma oxidization.

5. The method of claim 4, wherein the mask pattern is at least partially oxidized or ashed.

6. The method of claim 2, wherein an upper portion of the part of the conductive pattern is converted to the second resistivity and a lower portion of the part of the conductive pattern remains at the first resistivity.

7. The method of claim 2, wherein the part of the conductive pattern is converted to the second resistivity from an upper surface to a bottom surface.

8. The method of claim 7, wherein an adjacent part of the conductive pattern adjacent to the part of the conductive pattern that is converted to the second resistivity remains at the first resistivity.

9. The method of claim 8, wherein a resistivity of the high-resistance part is 4 times or more the first resistivity.

10. The method of claim 2, wherein an entirety of the conductive pattern is converted to the high-resistance part.

11. A method of manufacturing a semiconductor device, comprising:
forming a conductive pattern having a main surface in a trench formed in a main surface of a dielectric layer,
wherein the dielectric layer includes one or more of silicon oxide, SiON, SiOCN, SiCN, SiOC, silicon nitride, and an organic material;
forming a mask pattern over the main surface of the dielectric layer, the mask pattern including an opening over the main surface of the conductive pattern;
converting a part of the conductive pattern through the opening into a high-resistance part having a higher resistivity than the conductive pattern before the converting through the opening;
removing the mask pattern;
forming a first via in contact with and on a conductive part of the main surface of the conductive pattern; and
forming a second via in contact with and on the high-resistance part,
wherein a portion of the second via contacting the high-resistance part is electrically conductive.

12. The method of claim 11, wherein the conductive pattern is made of Ru or W.

13. The method of claim 12, wherein the part of the conductive pattern is converted to an oxide by plasma oxidization.

14. The method of claim 13, wherein:
the mask pattern includes TiN, and
the mask pattern is at least partially oxidized.

15. The method of claim 11, wherein an upper portion of the part of the conductive pattern is converted to a high-resistance and a lower portion of the part of the conductive pattern remains at a same resistivity as before the converting a part.

16. The method of claim 11, wherein a thickness of the conductive pattern is in a range from 20 nm to 80 nm.

17. A method of manufacturing a semiconductor device, comprising:
forming an interlayer dielectric layer having a main surface over a substrate,
wherein the interlayer dielectric layer includes one or more of silicon oxide, SiON, SiOCN, SiCN, SiOC, silicon nitride, and an organic material;
forming a wiring pattern having a main surface in the main surface of the interlayer dielectric layer,
wherein the main surface of the wiring pattern and the main surface of the interlayer dielectric layer are coplanar;
forming a hard mask layer over the main surface of the wiring pattern;
patterning the hard mask layer to form an opening exposing a region of the main surface of the wiring pattern;
increasing a resistance of a portion of the exposed region of the main surface of the wiring pattern,
wherein another portion of the wiring pattern remains at a same resistivity as before the increasing a resistance of a portion of the exposed region of the wiring pattern;
removing remaining portions of the hard mask layer;
forming a first via in contact with and on the increased resistance portion of the wiring pattern and
forming a second via in contact with and on a main surface of the another portion of the wiring pattern,
wherein a portion of the first via contacting the increased resistance portion is electrically conductive.

18. The method of claim 17, wherein the increasing a resistance of a portion of the exposed region of the wiring pattern includes oxidizing the portion of the exposed region.

19. The method of claim 17, wherein the wiring pattern includes Ru.

20. The method of claim 17, wherein the hard mask layer includes TiN.

* * * * *